United States Patent
Masuda et al.

(10) Patent No.: US 6,989,536 B2
(45) Date of Patent: Jan. 24, 2006

(54) ELECTRON-BEAM WRITING DEVICE AND ELECTRON-BEAM WRITING METHOD

(75) Inventors: Osamu Masuda, Tokyo (JP); Kazumi Furuta, Tokyo (JP); Kunito Hayashi, Tokyo (JP); Kazuhiko Kobayashi, Tokyo (JP)

(73) Assignees: Konica Minolta Holdings, Inc., Tokyo (JP); Crestec Corporation, Tokyo (JP)

( * ) Notice: Subject to any disclaimer, the term of this patent is extended or adjusted under 35 U.S.C. 154(b) by 0 days.

(21) Appl. No.: 10/897,344

(22) Filed: Jul. 21, 2004

(65) Prior Publication Data

US 2005/0018496 A1 Jan. 27, 2005

(30) Foreign Application Priority Data

Jul. 24, 2003 (JP) ............................. 2003-201320

(51) Int. Cl.
*H01J 37/28* (2006.01)
*H01J 37/256* (2006.01)

(52) U.S. Cl. ...................... 250/310; 250/306; 250/307; 250/396 R; 219/121.12; 365/199

(58) Field of Classification Search ................ 250/310, 250/306, 307, 396 R; 219/121.12; 365/199
See application file for complete search history.

(56) References Cited

U.S. PATENT DOCUMENTS 5,838,119 A * 11/1998 Engle .................. 315/366
2002/0170887 A1 * 11/2002 Furuta et al. ........ 219/121.19

FOREIGN PATENT DOCUMENTS

JP 08-273583 A 10/1996

\* cited by examiner

*Primary Examiner*—Nikita Wells
(74) *Attorney, Agent, or Firm*—Frishauf, Holtz, Goodman & Chick, P.C.

(57) ABSTRACT

The present invention aims at providing a device and method for writing a line with a high degree of precision at high speed. Distance calculation means 311 calculates the start-to-end point distance L of a writing pattern (S502), and number-of-scan-clocks calculating means 312 calculates the number of scan clocks required to write the writing pattern based on the start-to-end point distance L and a unit distance corresponding to the minimum time resolution for a high-speed D/A converter 306 (S503). Count conversion means 605 separates the start-to-end point distance L into X and Y components to convert them in an equation using the number of scan clocks (S504). Based on the equation, variable rate calculating means 314 calculates an extinction ratio to determine the extinction ratio at a variable attenuator 307 (S505). ATT D/A converter 303 specifies the extinction ratio at the attenuator 307 to reduce the unit distance corresponding to the resolving power of the high-speed D/A converter 306 so that an electron beam will be irradiated and scanned at intervals of the reduced unit distance to perform writing.

16 Claims, 8 Drawing Sheets

ELECTRON-BEAM WRITING DEVICE AND ELECTRON-BEAM WRITING METHOD

BACKGROUND OF THE INVENTION

1. Field of the Invention

The present invention relates to electron-beam writing technology, and particularly to a technique for high-precision, high-speed writing.

2. Description of the Prior Art

In recent years, attempts have been made to perform writing using an electron-beam writing device (for example, see Japanese patent laid-open No. 273583/1996 (Hei 8-273583)). A predetermined pattern is written by such an electron-beam writing device in which a deflector deflects an electron beam so that the electron beam will be scanned over the surface of a target substrate material. The deflector typically consists of two units, i.e. a high-precision deflection unit and a high-speed deflection unit. The high-precision deflection unit specifies the position of a target area (hereinafter called a writing field), and the high-speed deflection unit deflects the electron beam within the writing field so that the electron beam will be scanned to create a writing pattern.

For example, the following describes a conventional method of writing an oblique line on a substrate material with reference to FIGS. 1 and 2 wherein FIG. 1 shows the principles of the conventional method by which the oblique line is written on the substrate and FIG. 2 shows how to write a line segment of the pattern shown in FIG. 1.

The electron beam writing device typically includes a high-precision D/A converter for driving the high-precision deflection unit and a high-speed D/A converter for driving the high-speed deflection unit. The high-precision D/A converter for driving the high-precision deflection unit operates at 16 or 18 bits, and the high-speed D/A converter for driving the high-speed deflection unit operates at fewer bits than the high-precision D/A converter, for example at 12 bits.

Therefore, when writing the same line, the deflector driven by the high-precision D/A converter can obtain the line with higher positional accuracy than that driven by the high-speed D/A converter. On the other hand, the deflector driven by the high-speed D/A converter can obtain the line at higher speed than that driven by the high-precision D/A converter.

In FIG. 1, a writing field 801 is a writing area controlled by the high-precision deflection unit, and a writing field 802 is a writing area controlled by the high-speed deflection unit. In this case, the high-precision D/A converter drives the high-precision deflection unit to specify the starting position of the writing pattern. Then the high-speed D/A converter drives the high-speed deflection unit to deflect an electron beam so that the electron beam will be scanned within the writing field 802 to create the writing pattern.

For example, as shown in FIG. 1, it is assumed that a line 803 consisting of line segments 803a, 803b, and 803c connected at their ends is written. In this case, a point 804a is the starting position of writing the line segment 803a, and a point 804b is the end position of the line segment 803a. The point 804b is also the starting position of the line segment 803b, and a point 804c is the end position of the line segment 803b. The point 804c is also the starting position of the line segment 803c, and a point 804d is the end position of the line segment 803c. In other words, the end position of the line segment 803a corresponds to the starting position of the line segment 803b, and the end position of the line segment 803b corresponds to the starting position of the line segment 803c.

When writing such a line 803, at the beginning, the high-precision D/A converter drives the high-precision deflection unit so as to deflect an electron beam to be positioned at point 804a, and after that, the high-speed D/A converter drives the high-speed deflection unit and hence the deflector to deflect an electron beam so that the electron beam will be scanned in such a manner to write the line segment 803a first, and then continue writing the line segments 803b and 803c in this order. In the following, it is described, with reference to FIG. 2, how to write the line segments 803a, 803b, and 803c.

FIG. 2 shows how to write a line segment, for example, the line segment 803a. In this case, the length of the line segment 803a is L, and a unit distance (distance corresponding to one dot) corresponding to the resolving power of the high-speed D/A converter is $L_{SO}$. The line segment 803a is separated into X and Y components to determine the position of the endpoint 804b of the line segment 803a. Then an electron beam is irradiated and scanned to write the line segment 803a. In the prior art, the unit distance corresponding to the resolving power of the high-speed D/A converter is set to the same value as that corresponding to the resolving power of the high-precision D/A converter.

Then, using the length L of the line segment 803a and the unit distance $L_{SO}$ corresponding to the resolving power of the high-speed D/A converter, the number of scan clocks (Count) required for the high-speed D/A converter to write from the starting point 804a to the endpoint 804b is calculated. The Count is defined by the following equation (1):

$$\text{Count} = \text{Round}(L/L_{SO})$$

where "Round" denotes to round off $L/L_{SO}$. For example, in FIG. 2, if the value of $L/L_{SO}$ for the line segment 803a is smaller than "4.5" the Count is "4" and if the value of $L/L_{SO}$ is equal to or larger than "4.5" the Count is "5". In this prior-art description, it is assumed that the value of $L/L_{SO}$ is equal to or lager than "4.5". Therefore, the number of scan clocks (Count) required to write from the point 804a to the point 804b is "5".

Then the length L of the line segment 803a is separated into X and Y components to convert the lengths of the X and Y components in an equation using the number of scan clocks (Count). Specifically, these conversions are made using the above-mentioned number of scan clocks (Count) and the unit distance $L_{SO}$ of the high-speed D/A converter according to the following equations (2):

$$X = (L_{SO} \times \text{Count}) \times \cos\theta, \text{ and}$$

$$Y = (L_{SO} \times \text{Count}) \times \sin\theta.$$

Thus the end position of the line segment 803a is determined using the unit distance $L_{SO}$ of the high-speed D/A converter and the number of scan clocks (Count) required to write from the starting point to the endpoint.

Then the electron beam is irradiated dot by dot (at every interval $L_{SO}$). Specifically, as shown in FIG. 2, the electron beam is irradiated at the starting position 804a (805a), and then at points 805b, 805c, 805d, 805e, and 805f in this order at regular intervals, $L_{SO}$. Since the point 805f is the fifth dot (Count=5) from the point 805a, the electron beam is irradiated up to the point 805f.

During this operation, the electron beam irradiated on the substrate scatters inside the substrate to cause an effect as if portions in the neighboring area are irradiated by the electron beam. Therefore, although the electron beam is irradiated at regular intervals of the unit distance, the scattering events of the electron beam inside the substrate results in writing the line segment 803a.

The line segments 803b and 803c are written in the same manner to create the line 803.

If the value of $L/L_{SO}$ is smaller than "4.5" since the Count is "4" the electron beam is irradiated up to the point 805e.

In the prior art, however, the unit distance $L_{SO}$ corresponding to the resolving power of the high-speed D/A converter needs to be shortened when higher positional accuracy is necessary to write the starting point and endpoint of a line. To this end, more bits are required, causing a problem that the writing speed is inevitably decreased. On the other hand, the unit distance $L_{SO}$ corresponding to the resolving power of the high-speed D/A converter needs to be lengthened for high-speed writing of a line. To this end, the number of bits has to be reduced, causing a problem that high positional accuracy cannot be obtained.

Further, when the endpoint of a line segment is calculated in the above-mentioned manner, there is a further problem that causes an endpoint error ΔL806. Although the point 804b as the end position of the line segment 803a exists between the points 805e and 805f, the electron beam cannot be irradiated at any point between the points 805e and 805f merely by using the unit distance corresponding to the resolving power of the high-speed D/A converter. In other words, the electron beam is irradiated either up to the point 805e or the point 805f. This is why the endpoint error 806 is inevitably caused.

SUMMARY OF THE INVENTION

The present invention is to solve the above problems, and it is an object thereof to provide an electron-beam writing device and an electron-beam writing method, which enable the high-precision, high-speed writing of a line from its writing start position to end position.

The above problems are solved by providing either of the following:

An electron-beam writing device comprising: (a) a first D/A converter for outputting a signal indicating a starting position to write a predetermined line segment having a predetermined length; (b) a second D/A converter for converting scan clocks into analog signals and sequentially outputting each of the analog signals; (c) a calculator for multiplying the number of scan clocks corresponding to the predetermined length and a unit distance together, the unit distance corresponding to the resolving power of the second D/A converter, to calculate an adjustment rate for adjusting the difference between the obtained multiplied value and the predetermined length; (d) a regulator for variably adjusting the analog signal outputted from the second D/A converter at the adjustment rate calculated by the calculator; and (e) an electron-beam scanning device into which the signal indicating the start position outputted from the first D/A converter and the analog signal outputted from the second D/A converter and variably adjusted by the regulator are inputted to deflect and scan an electron beam.

An electron-beam writing method comprising: (a) a step of outputting a signal indicating the starting position to write a predetermined line segment having a predetermined length from a first D/A converter; (b) a step of outputting an analog signal from a second D/A converter in response to scan clocks; (c) a calculation step of multiplying the number of scan clocks corresponding to the predetermined length and a unit distance together, the unit distance corresponding to the resolving power of the second D/A converter, to calculate an adjustment rate for adjusting the difference between the obtained multiplied value and the predetermined length; (d) an adjustment step of variably adjusting the analog signal outputted from the second D/A converter at the adjustment rate calculated in the calculation step; and (e) a step of deflecting and scanning an electron beam based on the signal indicating the writing start position outputted from the first D/A converter and the analog signal adjusted in the adjustment step.

DETAILED DESCRIPTION OF THE PREFERRED EMBODIMENTS

The present invention will now be described with reference to FIGS. 3 through 9.

(Structure of Electron-Beam Writing Device)

Figure 1:
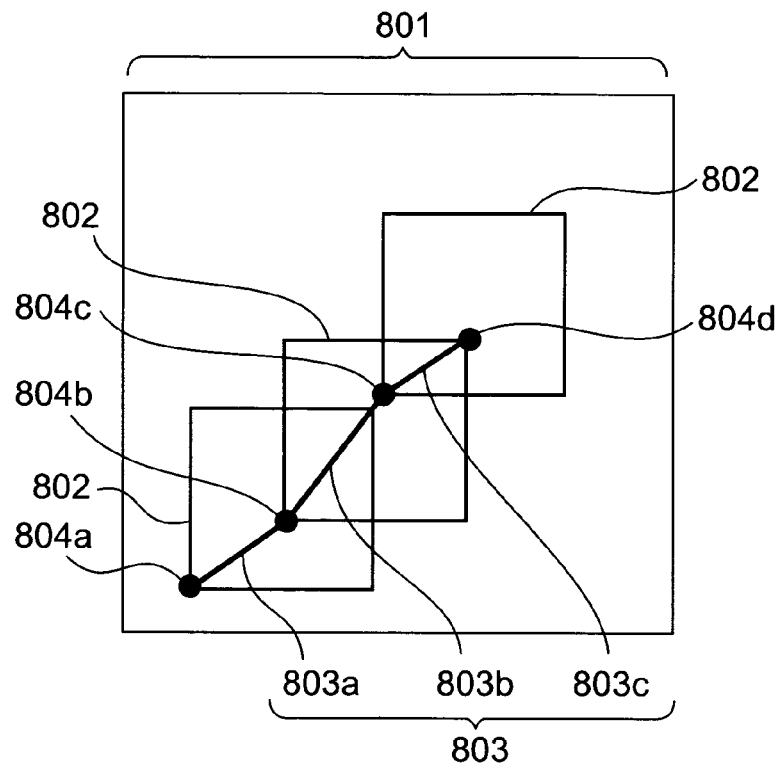
FIG. 1 is a diagram for explaining the principles of writing a line including oblique line segments using a conventional electron-beam writing device.
Figure 2:
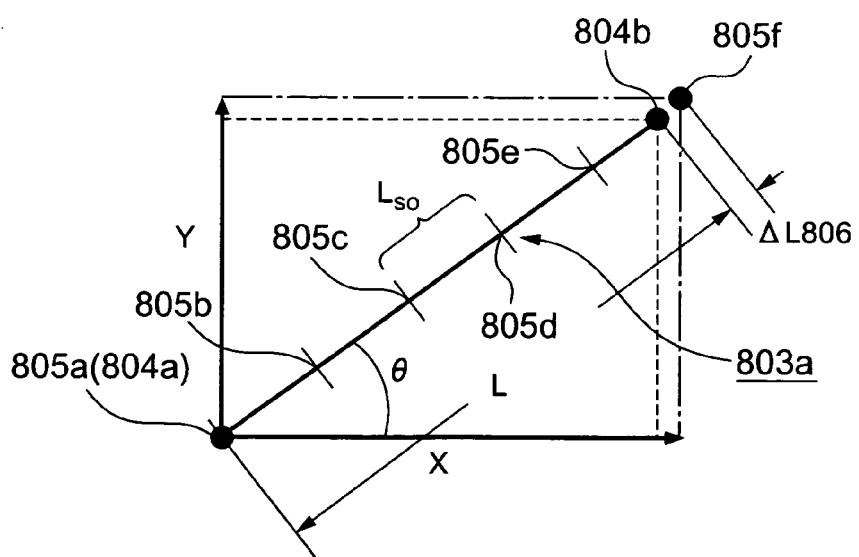
FIG. 2 is a diagram for explaining the principles of writing a line segment of the writing pattern shown in FIG. 1.
Figure 3:
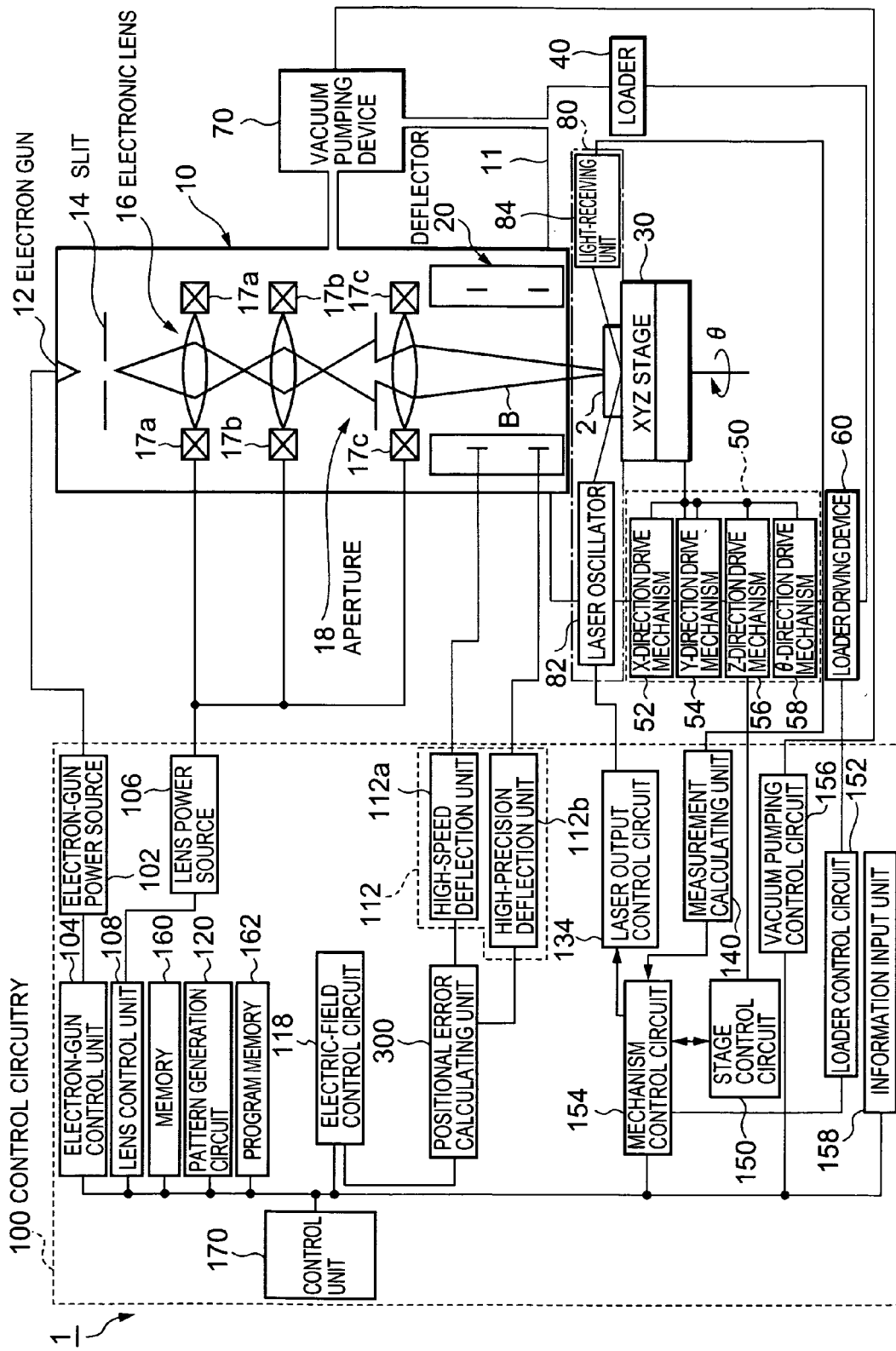
FIG. 3 is a schematic diagram of the structure of an electron-beam writing device according to an embodiment of the present invention.

FIG. 3 is a schematic diagram showing the general structure of an electron-beam writing device according to the embodiment. The electron-beam writing device 1 forms a high-current, high-resolution electron-beam probe for scanning a target substrate 2 at high speed. The device includes an electron gun 12 as electron-beam generating means that forms the high-resolution electron-beam probe to generate and irradiate an electron beam to the target, a slit 14 through which the electron beam from the electron gun 12 passes, electronic lenses 16 for controlling the focal position of the electron beam passing through the slit 14 on the substrate 2, an aperture 18 arranged in a path along which the electron beam is irradiated, and a deflector 20 for deflecting the electron beam to control the scanning position and the like of the target substrate 2. These components are arranged in a lens barrel 10 and maintained in a vacuum during irradiation of the electron beam.

The electron-beam writing device 1 further includes an XYZ stage 30 as a table on which the target substrate 2 is placed, a loader 40 as feed means for feeding the substrate 2 to the placement position on the XYZ stage 30, a measurement device 80 as measurement means for measuring a reference point on the surface of the substrate placed on the XYZ stage 30, stage driving means 50 for driving the XYZ stage 30, a loader driving device 60 for driving the loader 40, a vacuum pumping device 70 for exhausting air to evacuate the lens barrel 11, and control circuitry 100 as control means for control each component.

It is noted here that the electronic lenses 16 are created and controlled by a current value of each set of coils 17a, 17b, and 17c, respectively, to control the focal position of the electron beam.

The measurement device 80 includes a laser oscillator 82 for irradiating a laser beam to the substrate 2 to determine the height of the substrate 2, and a light-receiving unit 84 for receiving laser light (irradiated light) emitted from the laser oscillator 82 and reflected from the substrate 2. The laser oscillator 82 includes a collimating lens.

The stage driving means 50 includes an X-direction drive mechanism 52 for driving the XYZ stage 30 in the X-direction, a Y-direction drive mechanism 54 for driving the XYZ stage 30 in the Y-direction, a Z-direction drive mechanism 56 for driving the XYZ stage 30 in the Z-direction, and a θ-direction drive mechanism 58 for driving the XYZ stage 30 in the θ-direction. These mechanisms allow the three-dimensional movement and alignment of the XYZ stage 30.

The control circuitry 100 includes an electron-gun power source 102 for providing power to the electron gun 12, an electron-gun control unit 104 for adjusting and controlling the current, voltage, and the like at the electron-gun power source 102, a lens power source 106 for actuating the electronic lenses 16 (each of the multiple electronic lenses), and a lens control unit 108 for adjusting and controlling current for each electronic lens 16 at the lens power source 106.

The control circuitry 100 also includes a high-speed deflection unit 112a for controlling the deflector 20 to deflect an electron beam so that the electron beam will be scanned over the substrate, and a high-precision deflection unit 112b for specifying the position of an area to be scanned with the electron beam deflected by the deflector 20 under the control of the high-speed deflection unit 112a. The deflector 20, the high-speed deflection unit 112a, and the high-precision deflection unit 112b correspond to "electron-beam scanning means" of the present invention.

The control circuitry 100 further includes a positional error calculating unit 300, as features of the present invention, for calculating a positional error at the deflector 20 to urge the high-speed deflection unit 112a and the high-precision deflection unit 112b to correct the positional error, an electric-field control circuit 118 as electric-field control means for controlling the high-speed deflection unit 112a and the high-precision deflection unit 112b to control the electric field of the electron beam, and a pattern generation circuit 120 for generating a pattern to be written onto the substrate 2. The pattern generation circuit 120 generates a predetermined pattern based on information on shapes of various patterns stored in a memory 160. Although the detailed structure of the positional error calculating unit 300 will be described later, providing the positional error calculating unit 300 enables the high-precision, high-speed writing of lines including oblique lines.

Furthermore, the control circuitry 100 includes a laser output control circuit 134 for adjusting and controlling the output of laser light (the intensity of laser light) emitted from laser oscillator 82, and a measurement calculating unit 140 for calculating the measurement result based on the light-receiving result at the light-receiving unit 84.

In addition, the control circuitry 100 includes a stage control circuit 150 for controlling the stage driving means 50, a loader control circuit 152 for controlling the loader driving device 60, a mechanism control circuit 154 for controlling the laser output control circuit 134, the measurement calculating unit 140, the stage control circuit 150, and the loader control circuit 152, a vacuum pumping control circuit 156 for controlling the vacuum pumping device 70 to evacuate the lens barrel, an information input unit 158 for entering information on the properties and shape of the substrate 2, the memory 160 as storage means for storing the information entered and multiple kinds of information other than the information entered, a program memory 162 with various control programs stored in it, and a control unit 170, consisting, for example, of a CPU for controlling each of these components.

In the electron-beam writing device 1 having the structure mentioned above, when the substrate 2 is fed by the loader 40 and placed on the XYZ stage 30, the vacuum pumping device 70 sucks out air from the lens barrel 10, an air duct in a case 11, and the like. Then the electron gun 12 emits an electron beam.

The electron beam emitted from the electron gun 12 is passed through the electronic lenses 16 and deflected by the deflector 20. The deflected electron beam is then irradiated onto the surface of the substrate 2 on the XYZ stage 30, for example at a writing position on its flat surface 2a, to perform writing.

During this operation, the measurement device 80 determines the writing position on the substrate 2, and the control circuitry 100 adjusts and controls the values of current flowing through the respective sets of coils 17a, 17b, and 17c for the electronic lenses 16 based on the measurement result to control the position of the depth of focus, that is, the focal position, of electron beam B (see FIG. 5) so that the focal position will be moved to correspond to the above-mentioned writing position.

Alternatively, the control circuitry 100 may control the stage driving means 50 to move the XYZ stage 30 in such a way that the focal position of the electron beam B corresponds to the writing position. The alignment of the focal position with the writing position may be made by controlling either the electron beam or the XYZ stage 30, or by controlling both.

Figure 4:
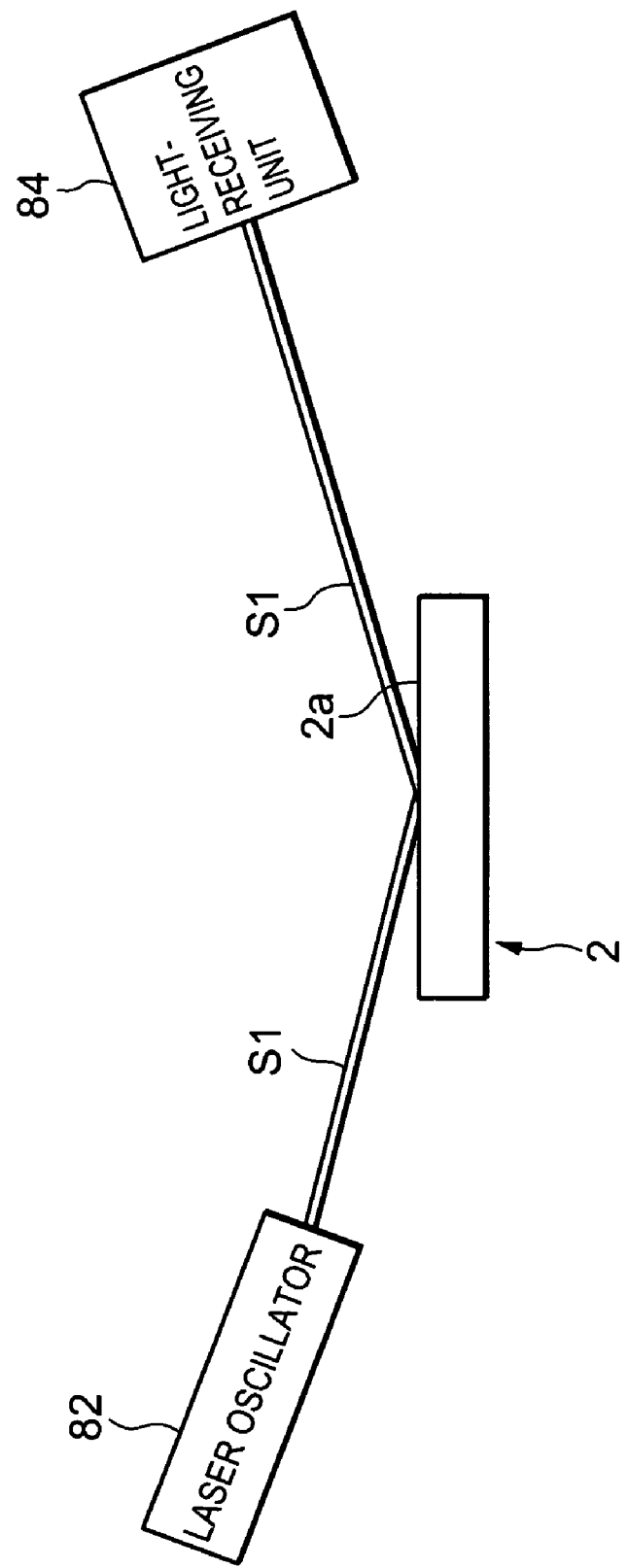
FIG. 4 is an illustration for explaining measurement principles of a measurement device in the electron-beam writing device shown in FIG. 3.

Referring next to FIG. 4, the measurement device 80 will be described. The measurement device 80 has the laser oscillator 82, the light-receiving unit 84, and so on.

The laser oscillator 82 emits a light beam S1 onto the substrate 2 from a direction crossing the electron beam, and the light-receiving unit receives the light beam S1 reflected from the flat surface 2a of the substrate 2, thereby detecting a change in the position of reflection of the light beam.

In this case, as shown in FIG. 4, since the light beam S1 is reflected from the flat surface 2a of the substrate 2, the position (height) of the flat surface 2a of the substrate 2 can be determined based on the change in the position of reflection of the light beam.

Then, the focal position of the electron beam is adjusted to the height position of the substrate prior to writing on the substrate.

Figure 5:
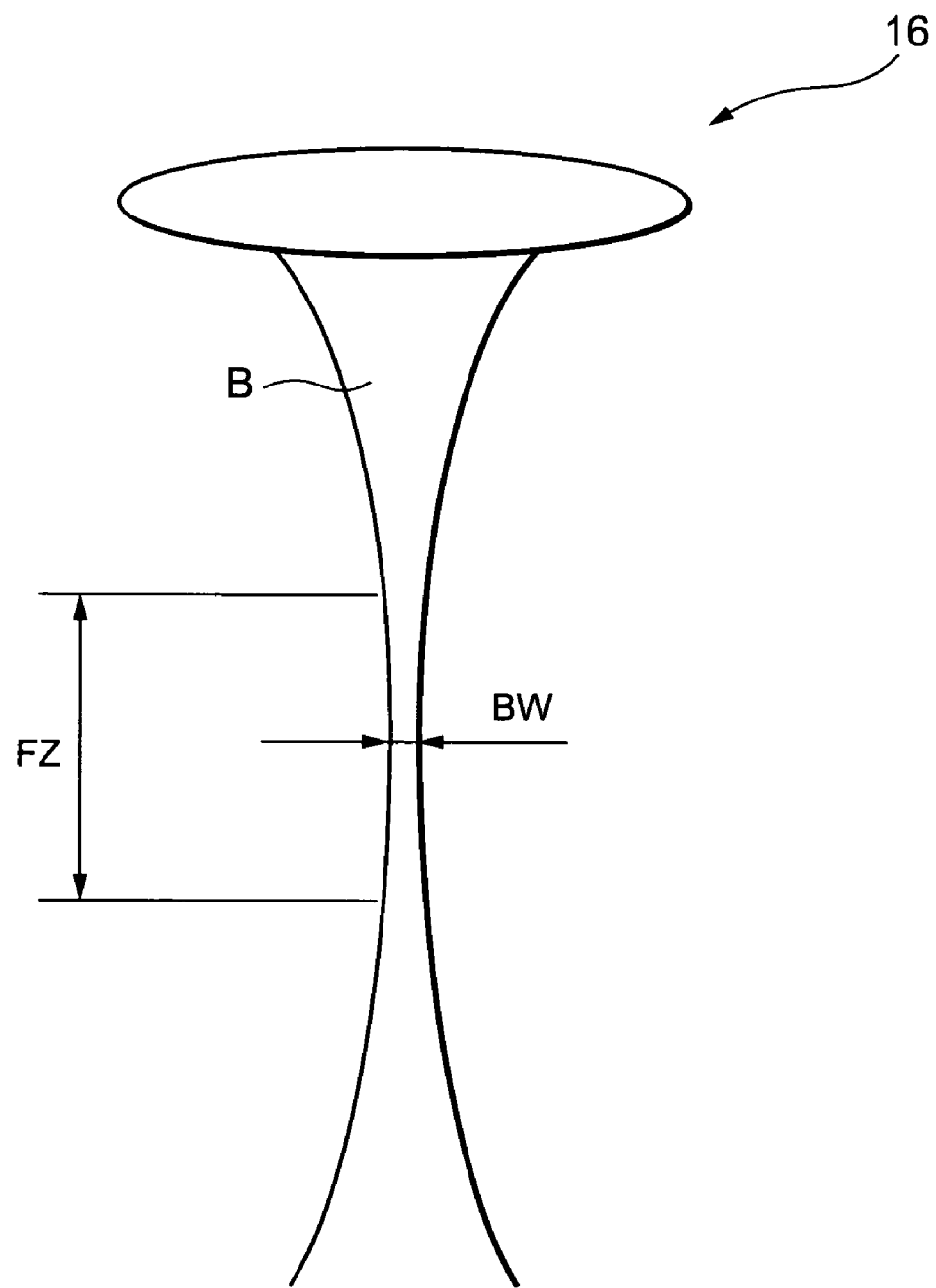
FIG. 5 is an illustration for explaining an electron beam and its beam waist.

Upon writing on the substrate 2, if the surface level of the substrate material has varied, the irradiation of the electron beam is controlled in such a manner that it falls within a depth of field FZ as shown in FIG. 5. The depth of penetration, or the depth of the processed feature, is controlled to vary according to the amount of exposure energy of the electron beam B irradiated. The amount of exposure energy corresponds to doses for the structure in which a pattern is to be created. In the embodiment, it is assumed that the writing region is a written layer and a portion corresponding to the flat surface 2a of the written layer is a written image area.

The control unit 170 performs various processing, such as computations, measurements, and control as mentioned above under program control. Such processing programs are prestored in the program memory 162 as control programs.

(Specific Structure of Calculation Unit)

Next, calculation processing for high-precision, high-speed writing, for example, of a line including oblique line segments, using the electron-beam writing device 1 will be described. This calculation processing is performed by the positional error calculating unit 300 as a feature of the present invention. The specific structure of the positional error calculating unit 300 is illustrated in FIG. 6.

Figure 6:
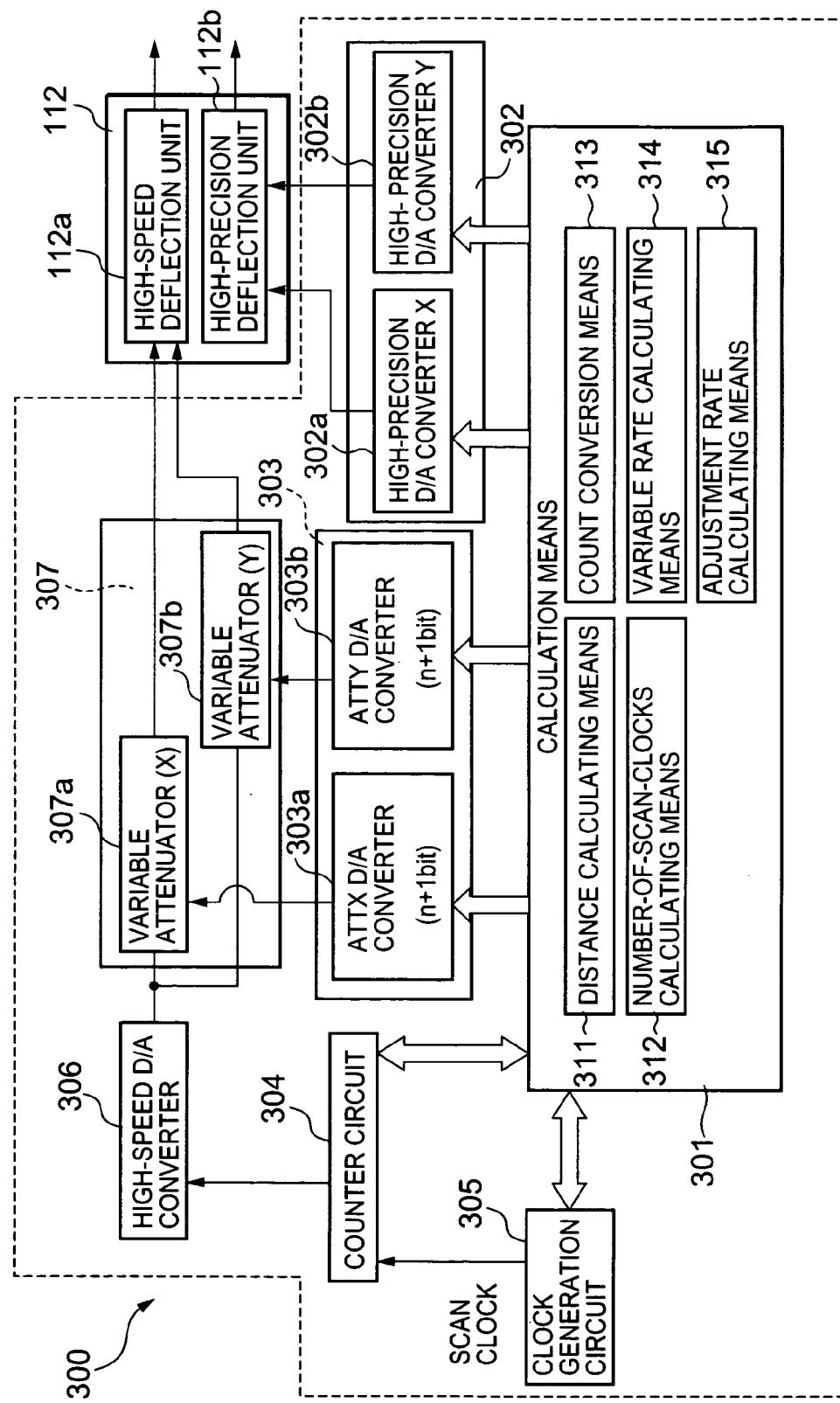
FIG. 6 is a functional block diagram showing the detailed structure of a calculation unit performing numerical computations for writing a line by the electron-beam writing device according to the embodiment of the present invention.

As shown in FIG. 6, the positional error calculating unit 300 of the electron-beam writing device 1 includes the following: a calculation means 301 for calculating the endpoint error of a pattern to determine writing conditions; a high-precision D/A converter 302 for converting a digital signal to an analog signal to control the high-precision deflection unit 112b; an ATT D/A converter 303 for performing a digital-to-analog conversion of a digital signal relating to the extinction ratio at a variable attenuator 307 sent from the calculation means 301 to specify the attenuation ratio at the variable attenuator 307; counter circuit 304 for counting the number of scan clocks (Count) for a high-speed D/A converter 306; a clock generation circuit 305 for setting the number of scan clocks for the high-speed D/A converter 306 based on the calculation results from the calculation means 301; the high-speed D/A converter 306 for converting a digital signal to an analog signal to control the high-speed deflection unit 112a; and the variable attenuator 307 for attenuating an output signal of line segment data from the high-speed D/A converter 306 according to the attenuation ratio calculated by the calculation means 301.

The high-speed D/A converter 306 operates, for example, at 12 bits, and the high-precision D/A converter 302 operates at 16 or 18 bits. Therefore, when writing the same line, the high-speed D/A converter 306 drives the deflector 20 to enable high-speed writing, while the high-precision D/A converter 302 drives the deflector 20 to enable high-precision writing.

The high-precision D/A converter 302 is made up of two parts: a high-precision D/A converter 302a for control relating to the position of an X component of the line to be written, and a high-precision D/A converter 302b for control relating to the position of a Y component of the line. The variable attenuator 307 is also made up of two parts: a variable attenuator 307a for attenuating the X component of the line, and a variable attenuator 307b for attenuating the Y component of the line. Further, the ATT D/A converter 303 is made up of two parts: an ATTX D/A converter 303a for performing a digital-to-analog conversion of a digital signal relating to the attenuation ratio sent from the calculation means 301 to specify the extinction ratio at the variable attenuator 307a, and an ATTY D/A converter 303b for performing a digital-to-analog conversion of a digital signal relating to the attenuation ratio sent from the calculation means 301 to specify the extinction ratio at the variable attenuator 307b.

As discussed above, the line segment to be written is separated into X and Y components so that the X and Y components will be processed separately. The reason for adopting such a method is that since direct variable attenuation of the line segment also makes a change in the direction of the line segment, processing for changing only the length of the line segment without changing the direction is needed.

As shown in FIG. 6, the calculation means 301 further includes distance calculation means 311, number-of-scan-clocks calculating means 312, Count conversion means 313, variable rate determining means 314, and adjustment rate calculating means 315.

The distance calculation means 311 is means for calculating the distance between a starting point ($P_S$) and an endpoint ($P_e$) based on the starting point ($P_S$) and endpoint ($P_e$) of a line to be written. The number-of-scan-clocks calculating means 312 is means for calculating the number of scan clocks required to write from the starting point ($P_S$) to the endpoint ($P_e$) based on the distance (L) calculated by the distance calculation means 311 and the unit distance corresponding to the resolving power of the high-speed D/A converter 306. The Count conversion means 313 is means for separating the distance (L) calculated by the distance calculation means 311 into X and Y components to convert the lengths (L) of the X and Y components in an equation using the number of scan clocks (Count) calculated by the number-of-scan-clocks calculating means 312. The variable rate determining means 314 is means for determining the digital ATTX and ATTY values to be inputted into the ATT D/A converter 303 from the X and Y components having the distance (L) converted by the Count conversion means 313 to specify the extinction ratio at the variable attenuator 307.

The adjustment rate calculating means 315 is means for calculating an adjustment rate AR that determines the extinction ratio at the variable attenuator 307 from the distance (L) calculated by the distance calculation means 311, the number of scan clocks (Count) calculated by the number-of-scan-clocks calculating means 312, and the unit distance $L_{S1}$ corresponding to the resolving power of the high-speed D/A converter 306.

The high-precision D/A converter 302 corresponds to a "first D/A converter" of the present invention and the high-speed D/A converter 30 corresponds to a "second D/A converter" of the present invention. The variable attenuator 307a and the variable attenuator 307b correspond to "variable means" of the present invention.

(Processing Procedure)

Figure 7:
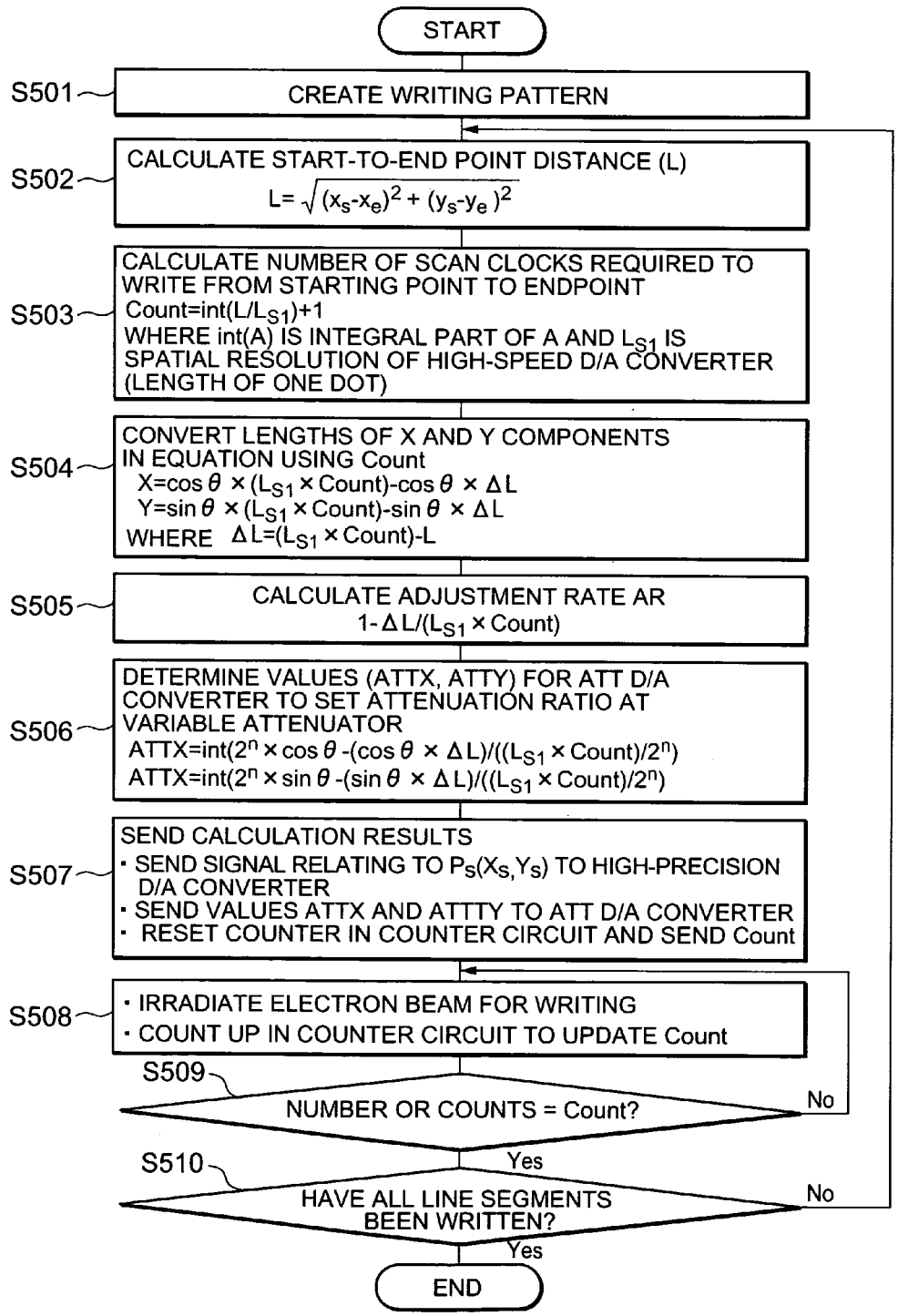
FIG. 7 is a flowchart showing an example of a processing procedure for writing a line by the electron-beam writing device according to the embodiment of the present invention.
Figure 8:
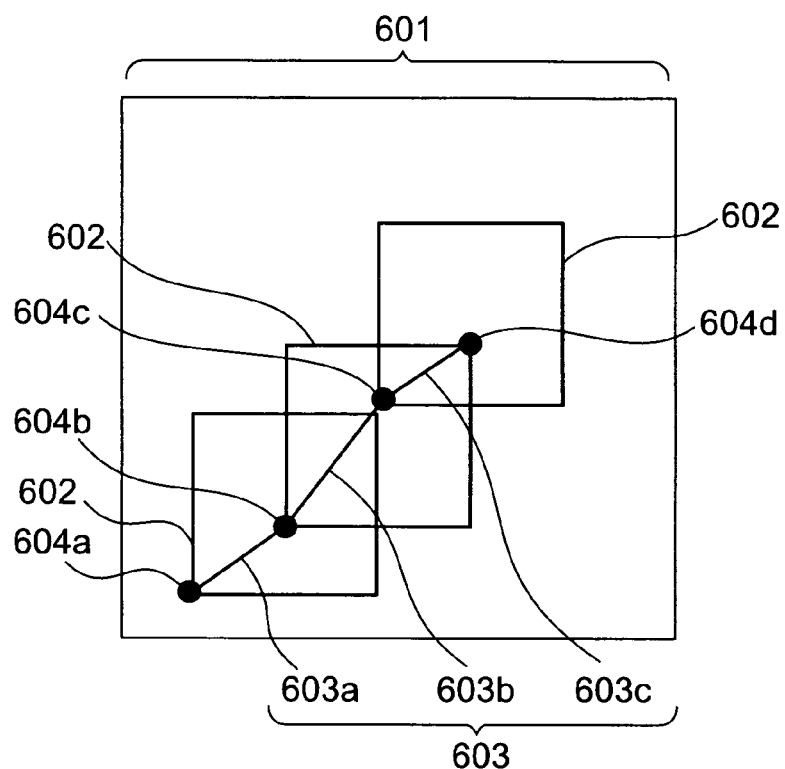
FIG. 8 is a diagram for explaining the principles of writing a line including oblique line segments using the electron-beam writing device according to the embodiment of the present invention.
Figure 9:
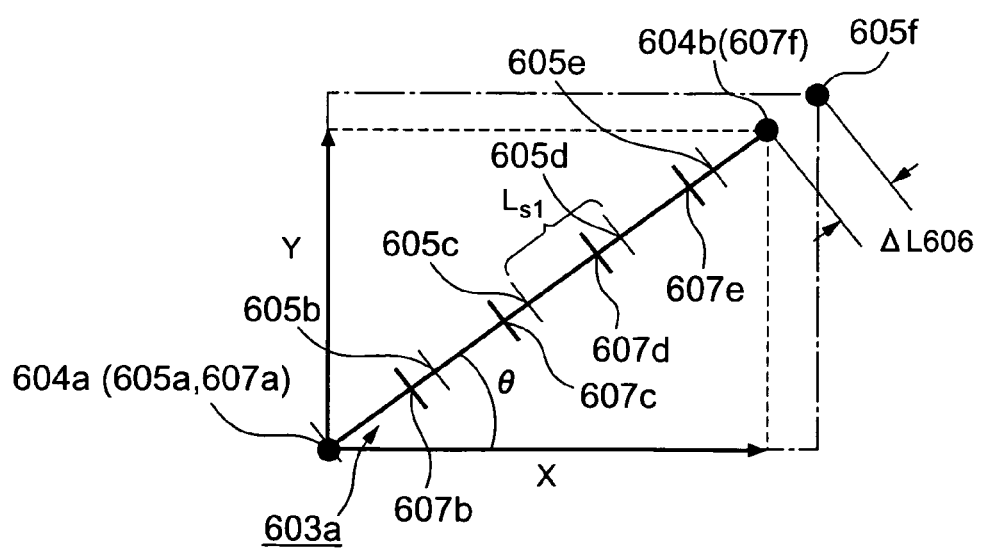
FIG. 9 is a diagram for explaining the principles of writing a line segment of the writing pattern shown in FIG. 8.

Referring next to FIGS. 7 to 9, a processing procedure for writing a pattern, for example, including oblique lines using the electron-beam writing device 1 having the above-mentioned positional error calculating unit 300 according to the embodiment will be described.

As shown in FIG. 7, pattern data to be written is first created (step S501). The pattern generation circuit 120 creates the pattern data based on information on shapes of various patterns stored in the memory 160.

For example, as shown in FIG. 8, it is assumed that a line 603 consisting of line segments 603a, 603b, and 603c connected at their ends is written. In this case, a point 604a is the writing start point (hereinafter called the starting point) of the line segment 603a, and a point 604b is the writing end position (hereinafter called the endpoint) of the line segment 603a. The point 604b is also the starting point of the line segment 603b, and a point 604c is the endpoint of the line segment 603b. The point 604c is also the starting point of the line segment 603c, and a point 604d is the endpoint of the line segment 603c. In other words, the endpoint of the line segment 603a corresponds to the starting point of the line segment 603b, and the endpoint of the line segment 603b corresponds to the starting point of the line segment 603c.

A writing field 601 shown in FIG. 8 is a writing area controlled by the high-precision deflection unit 112b of the electron-beam writing device 1, and a writing field 602 is a writing area controlled by the high-speed deflection unit 112a. In this case, the high-precision deflection unit 112 sets the position of the writing field 602. Then the high-speed deflection unit 112a deflects an electron beam within the writing field 602 so that the electron beam will be scanned to create the pattern.

When writing such a line 603, the high-speed D/A converter 306 controls the high-speed deflection unit 112a to deflect an electron beam so that electron beam will be scanned in such a manner to write the line segments 603a, 603b, and 603c sequentially in this order. In the following, it is described, with reference to FIG. 9, a processing procedure for writing the line segments 603a, 603b, and 603c.

FIG. 9 shows how to write a line segment, for example, the line segment 603a. In this case, the unit distance corresponding to the resolving power of the high-speed D/A converter 306 is $L_{S1}$. In the embodiment, since the high-speed D/A converter 306 needs to have speed enough to write the line segment according to the number of clocks, the unit distance corresponding to the resolving power of the high-speed D/A converter 306 is set to a value equal to or lager than the unit distance corresponding to the resolving power of the high-precision D/A converter 302. On the other hand, the high-precision D/A converter 302 creates a signal indicating the starting point just once for each line segment, so that the unit distance corresponding to the resolving power of the high-precision D/A converter 302 is set to a value equal to or smaller than the unit distance corresponding to the resolving power of the high-speed D/A converter 306, thus trading off speed for improved positioning accuracy. The result is that the control by the high-speed D/A converter 306 enables the high-speed writing of the pattern and the control by the high-precision D/A converter 302 enables high-precision positioning.

After the pattern data on the line 603 is created at step S501, the distance calculation means 311 calculates the start-to-end point distance L based on the position $P_S$ ($x_s$, $y_s$) of the starting point 604a and the position $P_e$ ($x_e$, $y_e$) of the endpoint 604b of the line segment 603a (step S502). The start-to-end point distance L is determined by the following equation (3):

$$L=\{(x_s-x_e)^2+(y_s-y_e)^2\}^{1/2}.$$

Then the number-of-scan-clocks calculating means 312 calculates the number of scan clocks (Count) required for the high-speed D/A converter 306 to write from the position $P_S$ ($x_s$, $y_s$) of the starting point 604a to the position $P_e$ ($x_e$, $y_e$) of the endpoint 604b based on the start-to-end point distance L of the line segment 603a calculated by the distance calculation means 311 and the unit distance $L_{S1}$ corresponding to the resolving power of the high-speed D/A converter 306 (step S305). The number-of-scan-clocks calculating means 312 according to the present invention calculates the number of scan clocks (Count) using the following equation (4):

$$\text{Count}=\text{int}(L/L_{S1})+1$$

where int represents the integral part of ($L/L_{S1}$). For example, in the case of the line segment 603a in the embodiment, int($L/L_{S1}$) is "4". Then, since "1" is added to int($L/L_{S1}$), the Count becomes "5".

The Count conversion means 313 separates the start-to-end point distance L calculated by the distance calculation means 311 into X and Y components to convert the lengths of the X and Y components in an equation using the number of scan clocks (Count) calculated by the number-of-scan-clocks calculating means 312 (step S504). This conversion is defined by the following equations (5):

$$X=\cos\theta\times(L_{s1}\times\text{Count})-\cos\theta\times\Delta L, \text{ and}$$

$$Y=\sin\theta(L_{s1}\times\text{Count})-\sin\theta\times\Delta L,$$

where $\Delta L$ is represented as $\Delta L=(L_{s1}\times\text{Count})-L$, corresponding to the endpoint error 606 in FIG. 9. Further, cos θ and sin θ in the equation (5) are determined based on the following equations (6):

$$\cos\theta=(x_s-x_e)/L$$

$$\sin\theta=(y_s-y_e)/L$$

Thus the position of the endpoint of the line segment 603a is separated into the X and Y components, and their values are determined using the unit distance $L_{s1}$ corresponding to the resolving power of the high-speed D/A converter 306 and the number of scan clocks (Count) required to write from the starting point to the endpoint.

The adjustment rate calculating means 315 calculates an adjustment rate AR according to the following equation (7):

$$\text{Adjustment Rate } AR = (L_{s1}\times\text{Count} - \Delta L)/(L_{s1}\times\text{Count})$$

$$= 1 - \Delta L/(L_{s1}\times\text{Count})$$

Then, the variable rate determining mean 314 determines the digital ATTX and ATTY values to be inputted into the ATT D/A converter 303 using the adjustment rate AR so that the ATT D/A converter 303 can specify the extinction ratio at the variable attenuator 307 (step S506). The ATTX and ATTY values are determined by the following equations (8):

$$\text{ATTX}=\text{int}\{2^n\times(1-\Delta L/(L_{s1}\times\text{Count}))\times\cos\theta\}$$

$$\text{ATTY}=\text{int}\{2^n\times(1-\Delta L/(L_{s1}\times\text{Count}))\times\sin\theta\}$$

In this equation, "n" corresponds to the number of bits for ATT D/A converter 303. The number of bits in the ATT D/A converter 303 is set equal to or lager than that in the high-speed D/A converter 306.

For example, suppose that the number of bits in the ATT D/A converter 303 is equal to that in the high-speed D/A converter 306. In general, the ATT D/A converter 303 has ($L_{s1}\times\text{Count}$) as its maximum value. Here, if the length of ($L_{s1}\times\text{Count}$) is shorter than the length ($2_n\times L_{s1}$) using the maximum number of bits in the high-speed D/A converter 306, the ATT D/A converter 303 will have higher spatial resolution than the high-speed D/A converter 306. In this case, the component (cos θ×$\Delta L$) of the endpoint error is subtracted by making the most effective use of this feature.

Further, as a matter of course, the larger the number of bits in the ATT D/A converter 303 than that in the high-speed D/A converter 306, the higher the spatial resolution of the ATT D/A converter 303. Therefore, upon irradiation of electron beams, the unit distance corresponding to the resolving power of the high-speed D/A converter 306 is reduced by the amount corresponding to the endpoint error to irradiate the electron beam dot by dot.

Next, the calculation means 301 sends the high-precision D/A converter 302 a signal relating to the position $P_S$ ($x_s$, $y_s$) of the starting point 604a of the line segment 603 (step S507). Using this signal, the high-precision converter 302 controls the high-precision deflection unit 112b to set the position $P_S$ ($x_s$, $y_s$) as the electron-beam irradiation position.

The calculation means 301 also sends the ATT D/A converter 303 the ATTX and ATTY values (step S507). The ATT D/A converter 303 specifies the extinction ratio at the variable attenuator 307 based on these values. Further, the calculation means 301 resets the counter circuit 304 and sends the clock generation circuit 305 a signal relating to the number of scan clocks (Count) (step S507).

Then, based on the number of scan clocks (Count) sent from the clock generation circuit 305 and counted by the counter circuit 304, the high-speed D/A converter 306 outputs an analog signal for the line segment to be written to the variable attenuator (X) 307a and the variable attenuator (Y) 307b. The ATT-X D/A converter 303a sends an analog-converted signal of the ATTX value to specify the extinction ratio at the variable attenuator (X) 307a, while the ATTY D/A converter 303b sends an analog-converted signal of the ATT-Y value to specify the extinction ratio at the variable attenuator (Y) 307b. The variable attenuator 307 attenuates the output of the high-speed D/A converter 306. Specifically, the attenuation is done as shown in the following equations (9):

$$X = (L_{s1} \times \text{Count}) \times ATTX / 2^n$$
$$\cong (L_{s1} \times \text{Count}) \times \cos\theta(1 - \Delta L / (L_{s1} \times \text{Count}))$$
$$= \cos\theta \times (L_{s1} \times \text{Count}) - \cos\theta \times \Delta L$$
$$= (L_{s1} \times \text{Count} - \Delta L) \times \cos\theta$$
$$Y = (L_{s1} \times \text{Count}) \times ATTY / 2^n$$
$$\cong (L_{s1} \times \text{Count}) \times \sin\theta(1 - \Delta L / (L_{s1} \times \text{Count}))$$
$$= \sin\theta \times (L_{s1} \times \text{Count}) - \sin\theta \times \Delta L$$
$$= (L_{s1} \times \text{Count} - \Delta L) \times \sin\theta.$$

It means that the unit distance $L_{s1}$ corresponding to the resolving power of the high-speed D/A converter 306 is reduced by the amount corresponding to the endpoint error $\Delta L$. In other words, the unit distance $L_{s1}$ is reduced to $L_{s1} \times (1 - \Delta L/(L_{s1} \times \text{Count}))$. In the embodiment, the reduction rate, that is, the adjustment rate AR is $(1 - \Delta L/(L_{s1} \times \text{Count}))$.

The signal relating to the position $P_S$ ($x_s$, $y_s$) sent to the high-precision D/A converter 302 is then outputted to the high-precision deflection unit 112b to control the high-precision deflection unit 112b to set the position $P_S$ ($x_s$, $y_s$) as the electron beam irradiation position. Then, a signal relating to the position of the endpoint represented in the above-mentioned equation (9) is outputted to the high-speed deflection unit 112a.

The high-speed deflection unit 112a controls the deflector 20 to deflect the electron beam and write the line segment 603a (step S507). Upon the writing operation, the unit distance corresponding to the resolving power of the high-speed D/A converter 306 is reduced by the amount corresponding to the endpoint error based on the extinction ratio at the variable attenuator 307 set by the ATT D/A converter 303 as mentioned above so that the electron beam will be irradiated at every reduced unit distance (one dot).

Specifically, as shown in FIG. 9, the electron beam is first irradiated at the starting point 604a (607a), and then at the points 607b, 607c, 607d, 607e, and 607f in this order at every scan clock (Count). These points 607b, 607c, 607d, 607e, and 607f are the electron beam irradiation positions obtained as a result of the reduction of the unit distance $L_{s1}$, corresponding to the resolving power of the high-speed D/A converter 306, based on the reduction rate (ATTX/$2^n$, ATTY/$2^n$) calculated by the calculation means 301. In other words, as a result of the reduction based on the reduction rate (ATTX/$2^n$, ATTY/$2^n$), the unit distance becomes $\{L_{s1} \times (1 - \Delta L/(L_{s1} \times \text{Count}))\}$ so that the electron beam will be irradiated at every unit distance $\{L_{s1} \times (1 - \Delta L/(L_{s1} \times \text{Count}))\}$. Consequently, the distance between points (for example, distance between the point 607a and the point 607b or between the point 607b and the point 607c) is set equal to the unit distance $\{L_{s1} \times (1 - \Delta L/(L_{s1} \times \text{Count}))\}$.

The electron beam is irradiated while moving each irradiation position by one dot at every scan clock (Count), and the counter circuit 304 keeps count of the number of scan clocks (step S507). Then, each time the electron beam is irradiated, the counter circuit 304 determines whether the counted number of scan clocks is equal to the number of scan clocks (Count) sent from the calculation means 301 (step S509). If the counted number of scan clocks is not equal to the number of scan clocks (Count) (if No at step S509), the irradiation position is moved by one dot and the electron beam is irradiated (step S508). In the embodiment, since the point 607f is the fifth dot from the point 607a (Count=5), the electron beam is irradiated up to the point 607f. The point 607f corresponds to the endpoint 604b of the line segment 603a. Consequently, the above-mentioned calculation operations make is possible to improve the accuracy of writing the end position.

If the calculation processing according to the present invention is not performed, the electron beam is first irradiated at the starting point 604a (605a), and then at the points 605b, 605c, 605d, 605e, and 605f sequentially in this order at every scan clock with a space of $L_{S1}$ in the same manner as in the prior art. In this case, since the actual endpoint 605f does not correspond to the proper endpoint 604f, the pattern cannot be written with high accuracy.

On the other hand, if the counted number of scan clocks is equal to the number of scan clocks (Count), that is, when the counted number of scan clocks is "5" in the embodiment (if YES at step 509), then the calculation means 301 determines whether all the line segments (603a, 603b, and 603c) of the line 603 have been written (step S510).

For example, if only the line segment 603a of the line 603 has been written but not the rest of the line segments (if NO at step S510), the above-mentioned processing steps 502 to 509 are performed on the next line segment 603b.

After completion of writing the line segment 603b, the processing steps 502 to 509 are performed again to write the line segment 603c. After that, the calculation means 301 determines whether all the line segments (603a, 603b, and 603c) of the line 603 have been written (step S510). In the embodiment, since completion of writing up to the line segment 603c means the completion of all the line segments (since the answer to step S510 is Yes), the processing is ended (END).

The present invention is not limited to the aforementioned embodiment, and various modifications are possible within the scope of the gist of the present invention.

For example, the number-of-scan-clocks calculating means 312 may calculate the number of scan clocks (Count) to achieve the high-speed, high-precision writing of a line segment using the following equation (10):

$$\text{Count} = \text{int}(L/L_{S1}) \text{ (where } L = L_{S1}).$$

For example, in the embodiment, int(L/L$_{S1}$) for the line segment 603a becomes "4".

Then the Count conversion means 313 separates the start-to-end point L into X and Y components to convert these lengths in an equation using the number of scan clocks (Count). These conversions are defined by the following equations (11):

$$X = \cos\theta \times (L_{s1} \times \text{Count}) + \cos\theta \times \Delta L, \text{ and}$$

$$Y = \sin\theta \times (L_{s1} \times \text{Count}) + \sin\theta \times \Delta L,$$

where $\Delta L$ is represented as $\Delta L = L - (L_{s1 \times Count})$

Then the variable rate determining means 314 determines the ATTX and ATTY values. These ATTX and ATTY values are determined by the following equations (12):

$$\text{ATTX} = \text{int}\{2^n \times (1 + \Delta L/(L_{s1} \times \text{Count})) \times \cos\theta\}, \text{ and}$$

$$\text{ATTY} = \text{int}\{2^n \times (1 + \Delta L/(L_{s1} \times \text{Count})) \times \sin\theta\}.$$

In these equations, "n" corresponds to the number of bits for ATT D/A converter 303. The number of bits in the ATT D/A converter 303 is set equal to or lager than that in the high-speed D/A converter 306.

Then the variable attenuator 307 attenuates the line segment data (L$_{s1}$×Count). Specifically, the attenuation is done as shown in the following equations (13):

$$X = (L_{s1} \times \text{Count}) \times ATTX / 2^n$$
$$\cong (L_{s1} \times \text{Count}) \times \cos\theta(1 + \Delta L/(L_{s1} \times \text{Count}))$$
$$= \cos\theta \times (L_{s1} \times \text{Count}) + \cos\theta \times \Delta L, \text{ and}$$
$$Y = (L_{s1} \times \text{Count}) \times ATTY / 2^n$$
$$\cong (L_{s1} \times \text{Count}) \times \sin\theta(1 + \Delta L/(L_{s1} \times \text{Count}))$$
$$= \sin\theta \times (L_{s1} \times \text{Count}) + \sin\theta \times \Delta L.$$

It means that the unit distance $L_{s1}$ corresponding to the resolving power of the high-speed D/A converter 306 is extended by the amount corresponding to the endpoint error $\Delta L$. In other words, the unit distance $L_{s1}$ is extended to $\{L_{s1}(1+\Delta L/(L_{s1}\times\text{Count}))\}$. In this embodiment, the extension rate is $(1+\Delta L/(L_{s1}\times\text{Count}))$.

The signal relating to the position $P_S$ ($x_s$, $y_s$) sent to the high-precision D/A converter 302 is then outputted to the high-precision deflection unit 112b to control the high-precision deflection unit 112b to set the position $P_S$ ($x_s$, $y_s$) as the electron beam irradiation position. Then, a signal relating to the position of the endpoint represented in the above-mentioned equations (13) is outputted to the high-speed deflection unit 112a.

The high-speed deflection unit 112a controls the deflector 20 to deflect the electron beam and write the line segment 603a. Upon the writing operation, the unit distance corresponding to the resolving power of the high-speed D/A converter 306 is extended by the amount corresponding to the endpoint error based on the extinction ratio at the variable attenuator 307 so that the electron beam will be irradiated at every extended unit distance (1 dot).

The electron beam is irradiated while moving each irradiation position by one dot at every scan clock (Count). In this embodiment, since the unit distance is extended, the point 607f is the fourth dot (Count=4) from the point 607a, thus irradiating the electron beam up to the point 607f. The point 607f corresponds to the endpoint 604b of the line segment 603a. Consequently, the above-mentioned calculation operations make it possible to improve the accuracy of writing the end position.

In the aforementioned embodiments, although the number of scan clocks (Count) is defined by the equations (4) and (10), it may be represented as Count=Round(L/L$_{s1}$) In this case, however, the operational sign of $\Delta L$ needs to be changed depending on whether it should be rounded up or rounded down.

Figure 10:
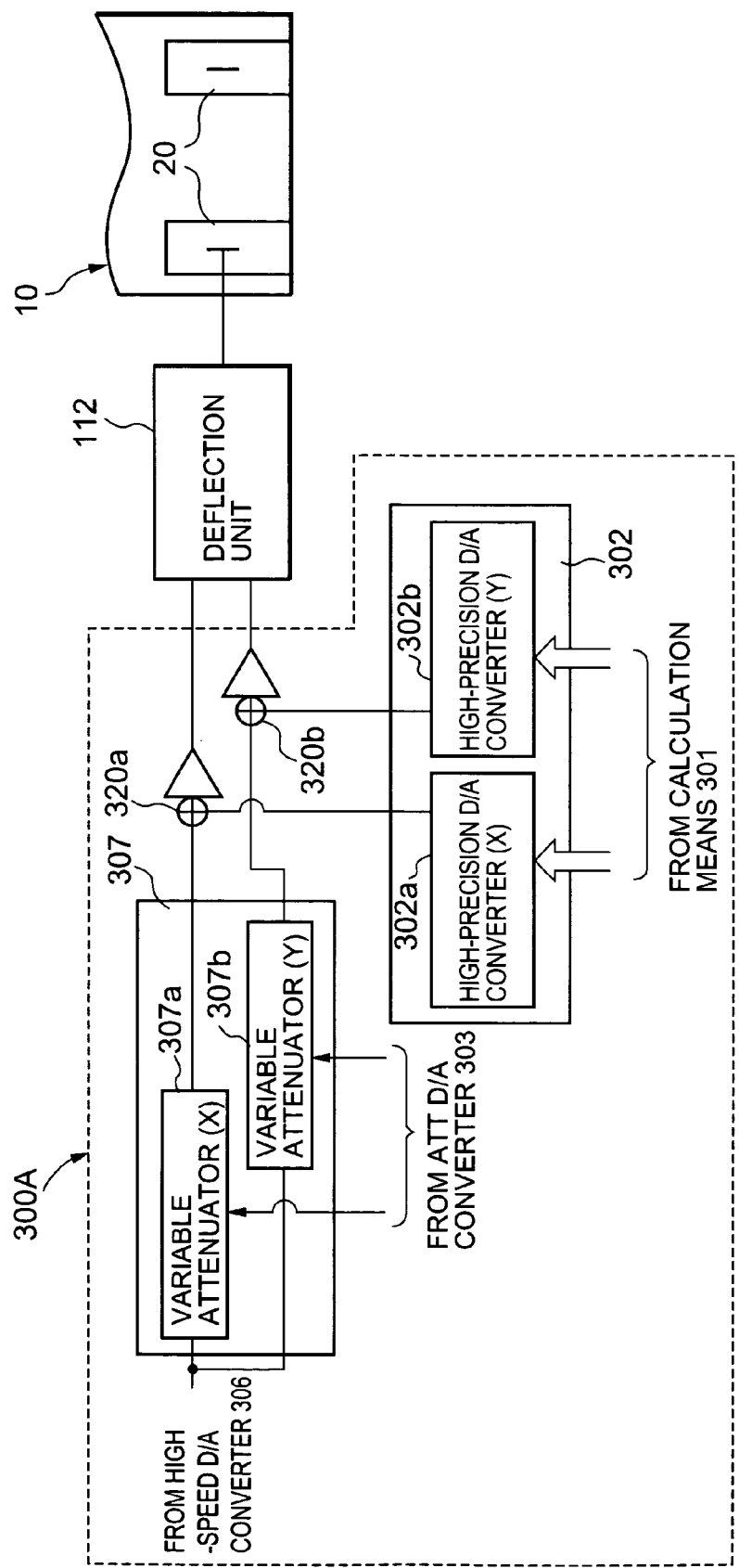
FIG. 10 is a block diagram of a modified example of the structure of the calculation unit in the electron-beam writing device according to the present invention.

FIG. 10 shows a modified embodiment of a positional error calculating unit in the electron-beam writing device according to the present invention.

A positional error calculating unit 300A in this modified embodiment has the same basic structure as the positional error calculating unit 300 shown in FIG. 3, except to which adders 320a and 320b are added. Components similar or corresponding to those of the positional error calculating unit 300 are given the same reference numerals or omitted.

The circuit action features that the output of the variable attenuator 307a and the output of the high-precision D/A converter 302a are added at the adder 320a and the output of the variable attenuator 307b and the output of the high-precision D/A converter 302b are added at the adder 320b before they are sent to a deflection unit 112 in an electron-beam scanning device. Added output signals are applied from the deflection unit 112 to an electrode of the deflector 20 arranged in the lens barrel 10.

Like in the aforementioned embodiments, this embodiment can achieve high-precision, high-speed writing. Further, the number of deflection units can be reduced, so that when the amount of deflection needs adjusting, the output of the deflection unit 112 has only to be adjusted, thus facilitating the adjustment process.

According to the present invention, when a line pattern including straight lines are to be written, an adjustment rate is calculated according to the endpoint error and used to vary the unit distance corresponding to the resolving power of the high-speed D/A converter, so that the pattern can be written by varying the distance, thereby making it possible to write the line with high degree of precision at high speed.

Also, according to the present invention, when a line pattern including straight lines are to be written, an adjustment rate is calculated according to the endpoint error and used to reduce the unit distance corresponding to the high-speed D/A converter, so that the pattern can be written by reducing the distance, thereby making it possible to write the line with high degree of precision at high speed.

Further, according to the present invention, the unit distance corresponding to the resolving power of the high-speed D/A converter is set longer than the unit distance corresponding to the resolving power of the high-precision D/A converter, so that the pattern can be written at high speed.

What is claimed is:

1. An electron-beam writing device comprising:
   a first D/A converter for outputting a signal indicating a starting position to write a predetermined line segment having a predetermined length;
   a second D/A converter for converting scan clocks into analog signals and sequentially outputting each of the analog signals;
   a calculator for multiplying the number of scan clocks corresponding to the predetermined length and a unit distance together, the unit distance corresponding to the resolving power of said second D/A converter, to calculate an adjustment rate for adjusting the difference between the obtained multiplied value and the predetermined length;
   a regulator for variably adjusting the analog signal outputted from said second D/A converter at the adjustment rate calculated by said calculator; and
   an electron-beam scanning device into which the signal indicating the starting position outputted from said first D/A converter and the analog signal outputted from said second D/A converter and variably adjusted by said regulator are inputted to deflect and scan an electron beam.

2. The device according to claim 1, wherein the number of scan clocks is a value calculated by dividing the length of the line segment by the unit distance corresponding to the resolving power of said second D/A converter, dropping the fraction portion of the division result, and adding one to the number after the fraction portion is dropped.

3. The device according to claim 2, wherein said calculator calculates the adjustment rate based on the difference obtained by subtracting the length of the line segment from the multiplied value obtained by multiplying the number of scan clocks and the unit distance corresponding to the resolving power of said second D/A converter.

4. The device according to claim 3, wherein said regulator attenuates the analog signal from said second D/A converter at the adjustment rate calculated by said calculator, and inputs the attenuated analog signal into said electron-beam scanning device.

5. The device according to claim 1, wherein the number of clocks is a value calculated by dividing the length of the line segment by the unit distance corresponding to the resolving power of said second D/A converter, and dropping the fraction portion of the division result.

6. The device according to claim 5, wherein said calculator calculates the adjustment rate based on the difference obtained by subtracting, from the length of the line segment, the multiplied value obtained by multiplying the number of scan clocks and the unit distance corresponding to the resolving power of said second D/A converter.

7. The device according to claim 6, wherein said regulator attenuates the analog signal from said second D/A converter at the adjustment rate calculated by said calculator, and inputs the attenuated analog signal into said electron-beam scanning device.

8. The device according to claim 1, wherein the unit distance corresponding to the resolving power of said second D/A converter is longer than the unit distance corresponding to the resolving power of said first D/A converter.

9. The device according to claim 1 further comprising an adder for adding the output of said first D/A converter and the output of said second D/A converter before they are inputted into said electron-beam scanning device.

10. An electron-beam writing method comprising:
    a step of outputting a signal indicating the starting position to write a predetermined line segment having a predetermined length from a first D/A converter;
    a step of outputting an analog signal from a second D/A converter in response to scan clocks;
    a calculation step of multiplying the number of scan clocks corresponding to the predetermined length and a unit distance together, the unit distance corresponding to the resolving power of the second D/A converter, to calculate an adjustment rate for adjusting the difference between the obtained multiplied value and the predetermined length;
    an adjustment step of variably adjusting the analog signal outputted from the second D/A converter at the adjustment rate calculated in said calculation step; and
    a step of deflecting and scanning an electron beam based on the signal indicating the start position outputted from the first D/A converter and the analog signal adjusted in said adjustment step.

11. The method according to claim 10, wherein the number of scan clocks is calculated by dividing the length of the line segment by the unit distance corresponding to the resolving power of the second D/A converter, dropping the fraction portion of the division result, and adding one to the number after the fraction portion is dropped.

12. The method according to claim 11, wherein the adjustment rate is calculated in said calculation step based on the difference obtained by subtracting the length of the line segment from the multiplied value obtained by multiplying the number of scan clocks and the unit distance corresponding to the resolving power of the second D/A converter.

13. The method according to claim 12, wherein the analog signal from the second D/A converter is attenuated in said adjustment step at the adjustment rate calculated in said calculation step.

14. The method according to claim 10, wherein the number of clocks is a value calculated by dividing the length of the line segment by the unit distance corresponding to the resolving power of the second D/A converter, and dropping the fraction portion of the division result.

15. The method according to claim 14, wherein the adjustment rate is calculated in said calculation step based on the difference obtained by subtracting, from the length of the line segment, the multiplied value obtained by multiplying the number of scan clocks and the unit distance corresponding to the resolving power of the second D/A converter.

16. The method according to claim 10, wherein the output of the first D/A converter and the output of the second D/A converter are added prior to said electron beam deflecting and scanning step.

* * * * *